US010622934B1

(12) United States Patent
Goyco

(10) Patent No.: US 10,622,934 B1
(45) Date of Patent: Apr. 14, 2020

(54) PHOTOVOLTAIC GENERATOR COVER AND CABLE METHOD OF MANUFACTURE

(71) Applicant: Carlos Goyco, Guanica, PR (US)

(72) Inventor: Carlos Goyco, Guanica, PR (US)

( * ) Notice: Subject to any disclaimer, the term of this patent is extended or adjusted under 35 U.S.C. 154(b) by 143 days.

(21) Appl. No.: 15/433,517

(22) Filed: Feb. 15, 2017

Related U.S. Application Data

(63) Continuation-in-part of application No. 14/208,557, filed on Mar. 13, 2014, now abandoned.

(51) Int. Cl.

| | | |
|---|---|---|
| *H02S 10/40* | (2014.01) | |
| *H01L 31/0468* | (2014.01) | |
| *H01L 31/028* | (2006.01) | |
| *H02S 99/00* | (2014.01) | |
| *H01R 24/60* | (2011.01) | |
| *H01R 107/00* | (2006.01) | |
| *H04B 1/3888* | (2015.01) | |

(52) U.S. Cl.
CPC ............ *H02S 10/40* (2014.12); *H01L 31/028* (2013.01); *H01L 31/0468* (2014.12); *H01R 24/60* (2013.01); *H02S 99/00* (2013.01); *H01R 2107/00* (2013.01); *H04B 1/3888* (2013.01)

(58) Field of Classification Search
CPC ...... C01B 32/19; C01B 32/184; C01B 32/182
See application file for complete search history.

(56) References Cited

U.S. PATENT DOCUMENTS

| | | | | |
|---|---|---|---|---|
| 6,726,994 | B1 * | 4/2004 | Araki | ............ B32B 27/06 428/411.1 |
| 2011/0311722 | A1 * | 12/2011 | Faris | ............ B82Y 20/00 427/203 |
| 2015/0132488 | A1 * | 5/2015 | Lee | ............ B81C 1/00492 427/249.1 |

* cited by examiner

*Primary Examiner* — Austin Murata
(74) *Attorney, Agent, or Firm* — Luis Figarella

(57) ABSTRACT

A photovoltaic cell module includes a housing, a graphene (bidimensional (2D) compounds per $sp^2$-chain of hybrid carbon atoms in honeycomb configuration) double layer translucent photovoltaic cell energy generator and a low resistivity graphene (bidimensional (2D) compounds per $sp^2$-chain of hybrid carbon atoms in honeycomb configuration) (a thousand times more conductive than copper) connection cable and method of manufacture, so as to connect the device to the other components with minimal energy losses. As such, it is related to chargers for portable electronic devices, and more particularly to a photovoltaic portable device charger having a built in photovoltaic generator and low resistivity graphene cable and low-profile 1.44 mm connector.

7 Claims, 13 Drawing Sheets

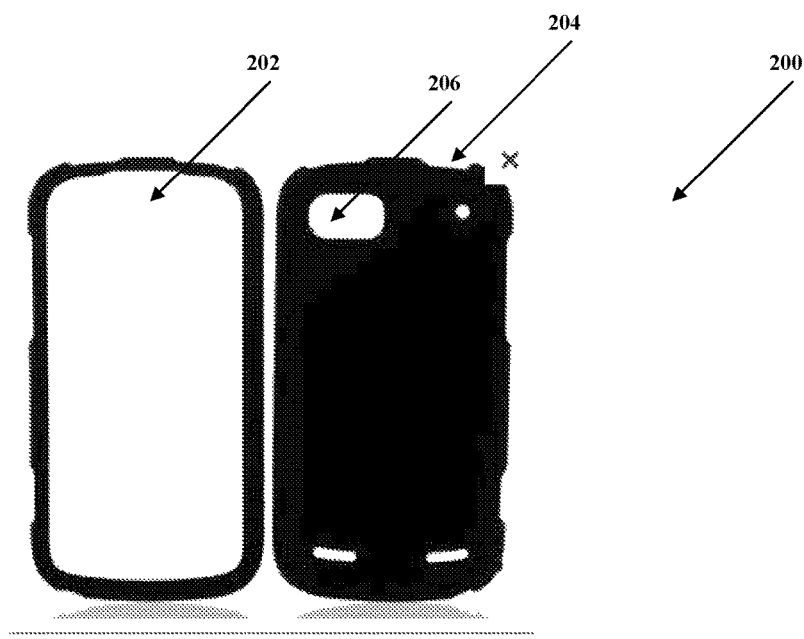
Figure 2
Prior Art
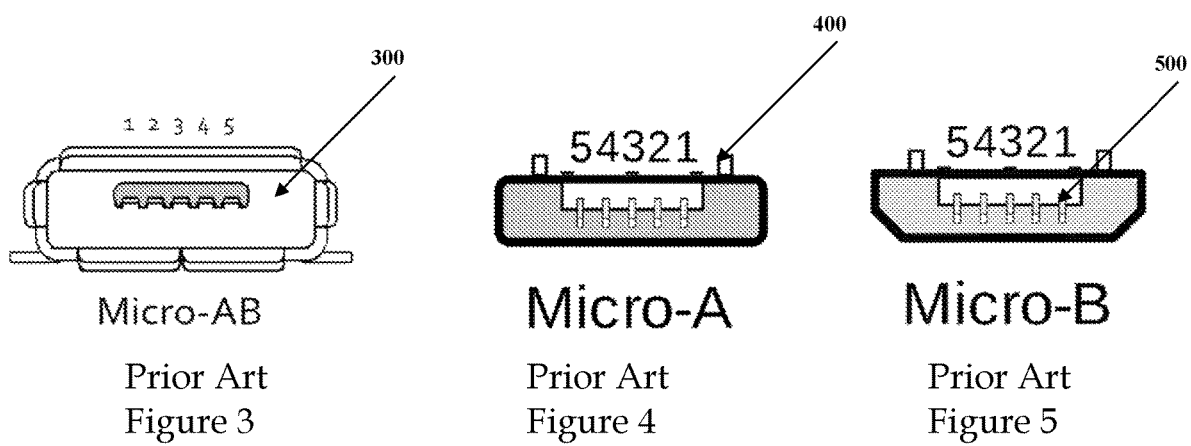
Prior Art
Figure 3
Prior Art
Figure 4
Prior Art
Figure 5

PHOTOVOLTAIC GENERATOR COVER AND CABLE METHOD OF MANUFACTURE

CROSS-REFERENCE TO RELATED APPLICATIONS

This application is a continuation-in-part of co-pending U.S. patent application Ser. No. 14/208,557 titled "Photovoltaic Generator Cover and Cable Method of Manufacture", filed on Mar. 13, 2014 the disclosure of which is herein incorporated by reference in its entirety.

PATENTS CITED

The following documents and references are incorporated by reference in their entirety, USB Revision 3.0 Specification Revision 1.1 and USB Power Delivery Specification, Hsu (U.S. Pat. No. 6,977,479), Tan (U.S. Pat. Appl. No. 2010/0317413), Godston et al (U.S. Pat. Appl. No. 2006/0270469) and Harmon et al (U.S. Pat. Appl. No. 2009/0170574).

FIELD OF THE INVENTION

This invention is related in general to photovoltaic powered generators and chargers for the operation and charging of portable electronic devices, and more particularly to a compact photovoltaic portable device charger having a built in photovoltaic generator and a graphene low resistivity cable.

DESCRIPTION OF THE RELATED ART

Cellular phones, smartphones, tablets, handsets and other similar portable electronic devices are equipped with rechargeable batteries, designed to be recharged via a connector that is also often used for data transfer. Most devices outside those from Apple Computer use variations of the USB family (including the mini and micro-USB formats), while Apple uses a variety of proprietary data/power connectors.

In contrast, most such devices are somewhere during the day in a position where they could use photovoltaic energy to charge their batteries. It would be desirable to have a portable photovoltaic generator capable of generating a predetermined voltage and amperage directly and in a manner compatible with the interface in the portable device in order to efficiently use photovoltaic energy to charge batteries in a portable electronic device such as a cellular phone, tablet, GPS or other.

Such a scenario is limited by the fact that such photovoltaic cells would be optimally placed on the outside of a cell phone case, but the high loss of energy within the cable connecting the photovoltaic cells to the device result in significant losses. What is needed, is a way in which to directly charge these devices in a compact and portable package that allows for efficient on the go charging.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In one aspect, the invention is about a portable photovoltaic generator comprising one or more graphene (bidimensional (2D) compounds per $sp^2$-chain of hybrid carbon atoms in honeycomb configuration) double layer 90% translucent photovoltaic cells connected through a low resistivity (thousand times more conducive than copper) graphene (bidimensional (2D) compounds per $sp^2$-chain of hybrid carbon atoms in honeycomb configuration) cable to a low profile 1.44 mm connector. In another aspect, said low resistivity cable is comprised of an Ethylene tetrafluoroethylene (ETFE) and graphene cable connecting said graphene (bidimensional (2D) compounds per $sp^2$-chain of hybrid carbon atoms in honeycomb configuration) double layer 90% translucent photovoltaic cells to said low profile 1.44 mm connector. In yet another aspect, said graphene double layer 90% translucent photovoltaic cells are placed directly on the surface of said handset (either in the screen and/or body). In another aspect, said graphene double layer 90% translucent photovoltaic cells are connected to each other via a similar low resistivity cable. In yet another aspect, said superconductor cable is comprised of an ETFE and graphene cable.

In one aspect, the invention is about a method for manufacturing a low resistivity cable comprising pressing an embossed design pattern across a thin film against a graphite source, heating said design pattern to a temperature above 255 a 280 deg. Celsius until a graphene layer is formed on said film, removing said film from said graphite source. In another aspect, said film is comprised of Ethylene tetrafluoroethylene (ETFE) or ETFE like material. In yet another aspect said embossing design pattern is pressed by a linear mold. In another aspect, said cable has one or more openings on one or more of the ETFE film surfaces that allow electrical connection access to the graphene layer. In another aspect, said electrical connection is accomplished by either a mechanical linkage, a capillary linkage, or by evaporating a metallic powder suspended in a fluid. In yet another aspect, said embossing design pattern is pressed by a wheel mold.

In one aspect, the invention is about an electronic device protective case comprising a shield case designed to snugly fit around an electronic device, said case having one or more graphene double layer 90% translucent photovoltaic cells attached to its exterior and one or more low resistivity cables terminating in a low-profile connector. In another aspect said low resistivity cable is comprised of an Ethylene tetrafluoroethylene (ETFE) and graphene cable connecting said graphene double layer 90% translucent photovoltaic cells to said low profile connector. In yet another aspect, said graphene double layer 90% translucent photovoltaic cells are connected to each other via a similar low resistivity cable. In another aspect, said low resistivity cable is comprised of an ETFE and graphene cable.

Other features and advantages of the present invention will become apparent upon examining the following detailed description of an embodiment thereof, taken in conjunction with the attached drawings.

BRIEF DESCRIPTION OF THE DRAWINGS

FIG. 2 shows an illustration of a Smartphone and a typical case, according to prior art.

FIGS. 3-5 show three micro-USB connector profiles, according to prior art.

Figure 1:
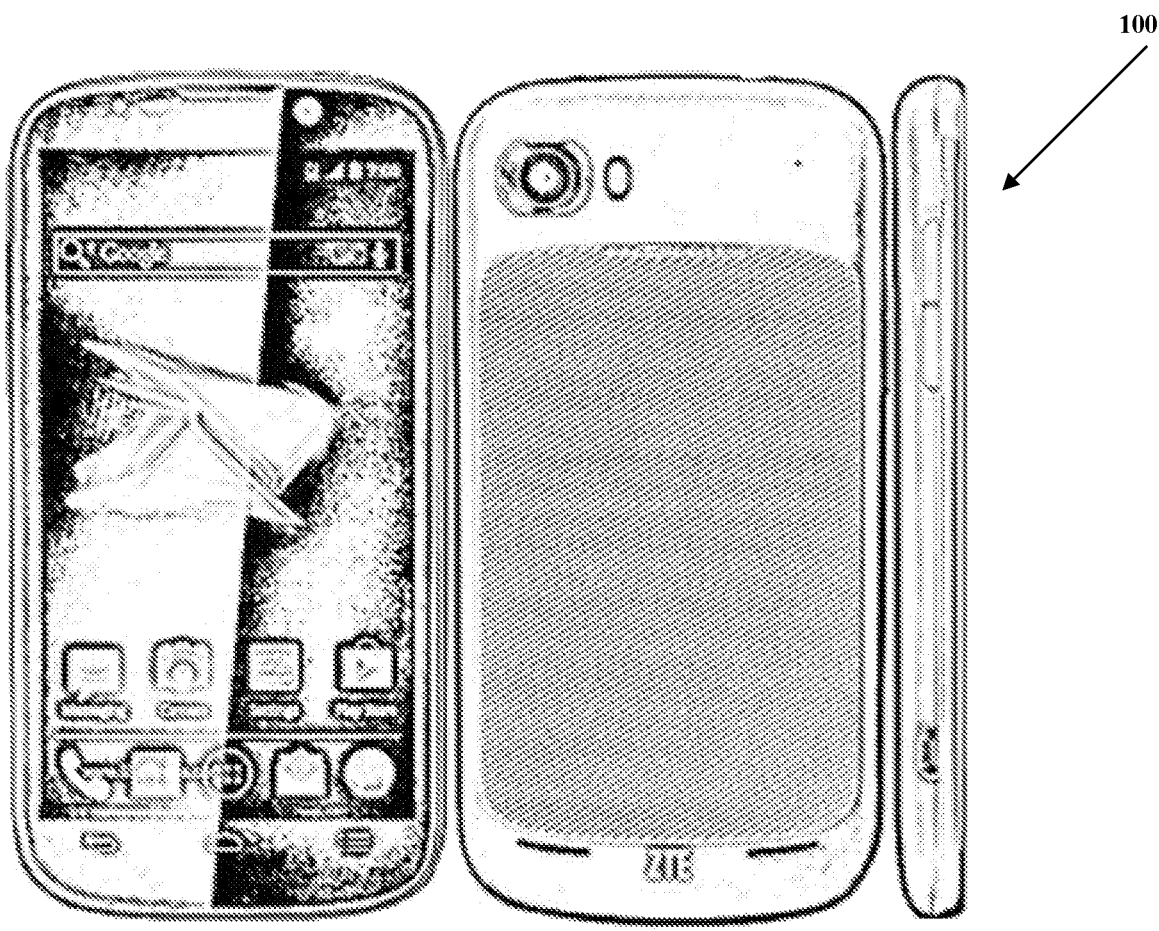
FIG. 1 shows an illustration of a Smartphone, according to prior art.
Figure 6:
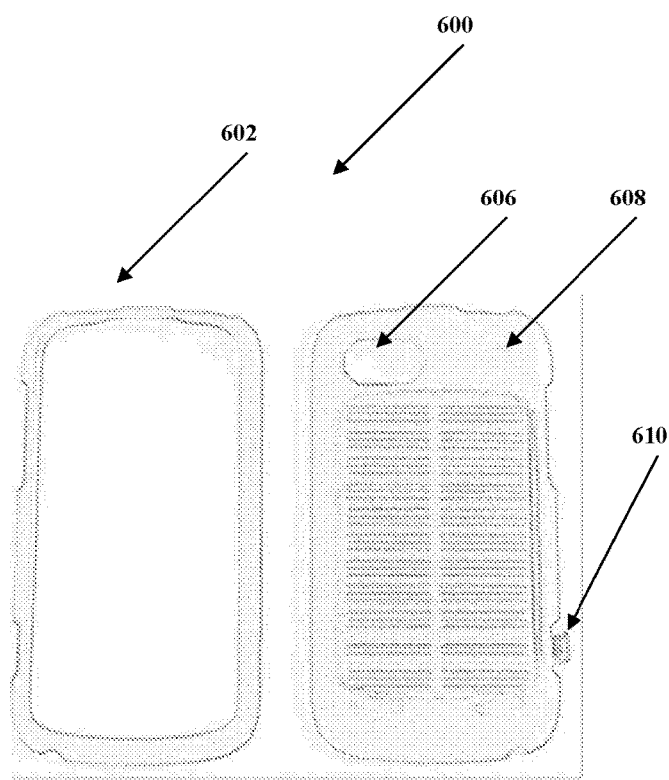
FIG. 6 shows an illustration of a Smartphone case photovoltaic cell position, according to an exemplary embodiment of the invention.
Figure 7:
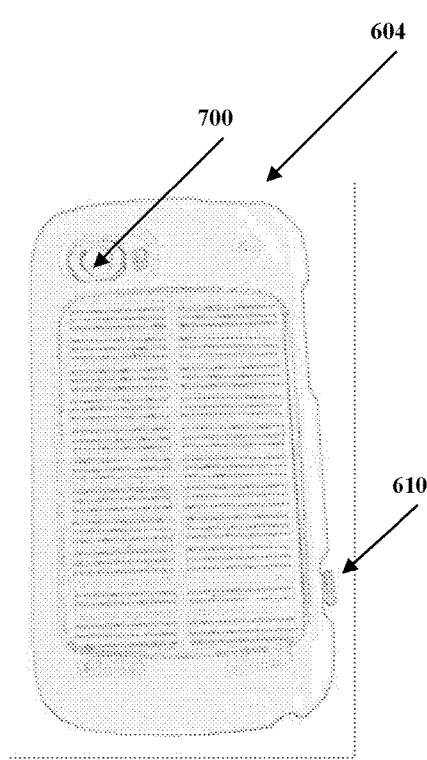
FIG. 7 shows an illustration of a Smartphone with a photovoltaic cell case and minimal loss cable and connector, according to an exemplary embodiment of the invention.
Figure 8:
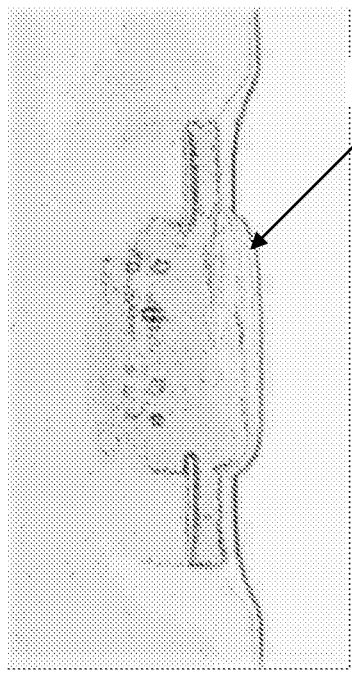
FIG. 8 shows an illustration of a minimal profile and loss connector, according to an exemplary embodiment of the invention.
Figure 9:
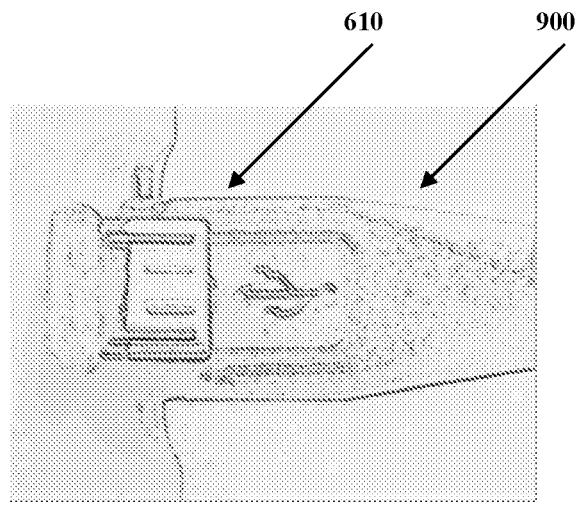
FIG. 9 shows a comparison illustration of a minimal profile 1.44 mm and loss connector to a traditional connector, according to an exemplary embodiment of the invention.

The above-described and other features will be appreciated and understood by those skilled in the art from the following detailed description, drawings, and appended claims.

DETAILED DESCRIPTION OF THE PREFERRED EMBODIMENT

To provide an overall understanding of the invention, certain illustrative embodiments and examples will now be described. However, it will be understood by one of ordinary skill in the art that the same or equivalent functions and sequences may be accomplished by different embodiments that are also intended to be encompassed within the spirit and scope of the disclosure. The compositions, apparatuses, systems and/or methods described herein may be adapted and modified as is appropriate for the application being addressed and that those described herein may be employed in other suitable applications, and that such other additions and modifications will not depart from the scope hereof.

Simplifications or omissions may be made to avoid obscuring the purpose of the section. Such simplifications or omissions are not intended to limit the scope of the present invention. All references, including any patents or patent applications cited in this specification are hereby incorporated by reference. No admission is made that any reference constitutes prior art. The discussion of the references states what their authors assert, and the applicants reserve the right to challenge the accuracy and pertinence of the cited documents. It will be clearly understood that, although a number of prior art publications are referred to herein, this reference does not constitute an admission that any of these documents form part of the common general knowledge in the art.

As used in the specification and claims, the singular forms "a", "an" and "the" include plural references unless the context clearly dictates otherwise. For example, the term "a transaction" may include a plurality of transaction unless the context clearly dictates otherwise. As used in the specification and claims, singular names or types referenced include variations within the family of said name unless the context clearly dictates otherwise.

Certain terminology is used in the following description for convenience only and is not limiting. The words "lower," "upper," "bottom," "top," "front," "back," "left," "right" and "sides" designate directions in the drawings to which reference is made, but are not limiting with respect to the orientation in which the modules or any assembly of them may be used.

It is acknowledged that the term 'comprise' may, under varying jurisdictions, be attributed with either an exclusive or an inclusive meaning. For the purpose of this specification, and unless otherwise noted, the term 'comprise' shall have an inclusive meaning—i.e. that it will be taken to mean an inclusion of not only the listed components it directly references, but also other non-specified components or elements. This rationale will also be used when the term 'comprised' or 'comprising' is used in relation to one or more steps in a method or process.

Referring to FIGS. 1-5 and 20 they illustrate various components of the prior Art related to personal portable computing devices, where such personal electronic devices 100, including cell phones, smart phones, tablets and other portable battery powered devices include some form of after-market cover 200. These covers come in various forms, as either a single piece or front 202 and back 204 portions that snap either together or to parts of the device 100. One or more openings 206 are provided for camera, flash, microphone, connectors and other access to the device 100.

Typically, these covers/shells are plastic, silicone or similar materials. Note that when we say plastic, we include both thermoplastic and thermosetting polymers (examples of these include polyethylene, polystyrene, polyvinyl chloride, polypropylene and polytetrafluoroethylene (PTFE), including materials such as nylon, Plexiglas, and others.

In an alternate embodiment, the p-member may be comprised of a carbon composite, metal, wood, bone, paper impregnated with moisture control agents or any composite thereof, or any material capable of supplying a sturdy, stable and cost effective surface.

While more and more connections to such devices are accomplished via wireless, power continues to be something much more easily transferred to the device via a cabled connection. The USB Battery Charging Specification defines new types of USB ports, e.g., charging ports. As compared to standard downstream ports, where a portable device can only draw more than 100 mA current after digital negotiation with the host or hub, charging ports can supply currents above 500 mA without digital negotiation.

A charging port supplies up to 500 mA at 5 V, up to the rated current at 3.6 V or more, and drops its output voltage if the portable device attempts to draw more than the rated current. The charger port may shut down if the load is too high. Such charging ports exist in two flavors: charging downstream ports (CDP), supporting data transfers as well, and dedicated charging ports (DCP), without data support. A portable device can recognize the type of USB port from the way the D+ and D− pins are connected.

For example, on a dedicated charging port, the D+ and D− pins are shorted. With charging downstream ports, current passing through the thin ground wire may interfere with high-speed data signals. Therefore, current draw may not exceed 900 mA during high-speed data transfer. A dedicated charge port may have a rated current between 500 and 1500 mA. There is no upper limit for the rated current of a charging downstream port, as long as the connector can handle the current (standard USB 2.0 A-connectors are rated at 1500 mA).

In one embodiment, shown in FIGS. 3-5, a Micro AB connector 300 on the host can accept either a Micro-A 400 or Micro-B 500 connector on the cable. In an alternate embodiment, any type of mini or micro USB, Apple or any other type of direct voltage and current connector may be used.

Referring to FIGS. 6-10 we illustrate the principal components of the invention. In one embodiment, a photovoltaic generator case 600 is formed of two halves, a front 602 and a back 604. (Again, in an alternate embodiment, the cover may be made of one, three or more portions). The back portion 604 has similar openings 606 for the other unit components (camera, flash, etc.), but one or more photovoltaic cells 608 are mounted on the one or more areas available. The photovoltaic cells 608 may be mounted over the back 604, in a cavity so that they are flush with the rest of the back 604 profile, or covered with a transparent protective film or layer.

In an alternate embodiment, the case is made transparent, and the cells 608 are mounted on the inside of case 604, so as to provide additional protection against use. For certain models, the placement of the cells 608 or cables may take into account optimal antenna performance. The cells 608 are linked to the unit 100 via a cable connected to a low profile 610 Micro-A or Micro-B connector (or Mini connector if that old a unit). As can be seen, the low-profile 1.44 mm connector 610 is significantly lower profile (when seen around the edge of the case 604, so that the friction within a pocket or purse does not 'pop-out' the connector, making it thus shorter in height than the comparable traditional cable connector 900. In one embodiment, said cable is a traditional low profile cable, ribbon or flat cable. In an alternate embodiment, the photocells are transparent, and placed over the screen or back of the unit, room temperature semiconductor cable 610 providing the connection to the handset without any case.

In an one embodiment, the cable is a low resistivity (thousand times more conductive than copper) made of GRAEFTENO (also known as graphene), in the form of a flat flexible cable 1004 having the property of conducting near lossless energy. This cable is connected to the low-profile 1.44 mm cap 1000 and a shortened connector 1002, making a slim connection capable of saving significant percentages of the energy traveling from said graphene (bidimensional (2D) compounds per $sp^2$-chain of hybrid carbon atoms in honeycomb configuration) double layer 90% translucent photovoltaic cells to said handset. In on embodiment, said cable and its manufacture process is comprised of an Ethylene tetrafluoroethylene (ETFE) or similar material membrane in combination with graphene.

Graphene resistivity on the (bidimensional (2D) compounds per $sp^2$-chain of hybrid carbon atoms in honeycomb configuration) is low resistivity (thousand times more conductive than copper). As one of the thinnest and hardest substances, it also has a stable chemical structure, (flexible), corrosion resistance, high temperature resistance and good chemical stability. However, this thin film of graphite would benefit from a mechanical carrier suitable to the bending and other mechanical motions present in an electronics package.

Ethylene tetrafluoroethylene, ETFE, is a fluorine based plastic that was designed to have high corrosion resistance and strength over a wide temperature range. ETFE is a polymer, and its systematic name is poly-ethylene-co-tetra-fluoroethylene. ETFE has a very high melting temperature, excellent chemical, electrical and high energy radiation resistance properties. Other similar insulating plastics (e.g. polyethylene, polyvinyl chloride) may also be used.

Referring to FIGS. 11-28, we see in one embodiment, a method for the manufacture of such a graphene cable 1004. To being, an ETFE membrane or film 1102 is placed on a graphite rod 1104, then pressed and heated by the pressure from an embossed design pattern 1106 (on a metal or other such heatable surface), in order to create one or more (bidimensional (2D) compounds per $sp^2$-chain of hybrid carbon atoms in honeycomb configuration) carbon channels 1304 adhered to its underside to form either a more (bidimensional (2D) compounds per $sp^2$-chain of hybrid carbon atoms in honeycomb configuration), or such other minimal thickness graphene chain, which enables it to operate as a said low resistivity conductor channel. This resulting thin graphene layer 1304 As with a multi-layer PCB, the process may be repeated to create more than one channel, if so desired.

We use a metal relief engraver so that a predetermined profile design covered in TEFLON prevents the ETFE from sticking to the relief engraver when it is hot. The relief engraver is preferably heated to a temperature between 255 and 280 C.° depending on the ambient temperature area where the ETFE membrane of 0.5 mm is pressed against de graphite bar, heating the graphite against the ETFE membrane near its fusion point of 280 C.°, the action turns the ETFE sticky, improving the graphite adhesion to said membrane's surface. When the ETFE membrane is separated from the graphite bar, an exfoliation process creates a Graphene bidimentional (2D) over the ETFE membrane. (potentially as a hot rolling process as shown below), such as a hot isostatic pressing process.

The hot-pressing process uses temperatures in the range of 255° C. to 280° C., and set pressures in the range of 0.5 megapascals (MPa) to 100 megapascals (MPa), based on the desired film material thermal capacity. Through hot pressing, we greatly reduce the graphene nano-ribbon unordered graphene (bidimensional (2D) compounds per $sp^2$-chain of hybrid carbon atoms in honeycomb configuration), so that the optimization process can achieve 80-100% graphene nano-dimensional orientation of the ribbon.

Note that the stamping may be accomplished in one embodiment (FIG. 16) via a continued engraver 1600 having one or more wheels (1602, 1604) with the engraver pattern 1106 being present along one said wheel 1602, and the other wheel 1604 acting as the backbone for the graphite, or as a graphite supply wheel. In order to engrave the ETFE film 1606 continuously, the upper wheel 1602 heats the ETFE film 1606 and is simultaneously pressed onto the film, while the lower 'graphite' wheel 1604 continuously creates a ribbon with the graphene on the exposed side of the film 1606, which may then be covered by another film to seal the graphene between them. In one embodiment, all pressing surfaces are covered in Teflon or similarly smooth materials to avoid any sticking.

The finished material we call graphene and forms on the ETFE membrane, specifically in the areas of pressure. The finished product Graphene cable 1502 that is a low resistivity medium that is held together via the ETFE film, which makes possible the materials transformation. In one embodiment, it is a sandwich of one or more layers (to provide for a ground return circuit, or a combination of voltages, or multiple paths), wherein each layer is made of a single carbon graphite layer between two ETFE layers, similar in makeup to a multi-layer PCB board.

Both ETFE plastic and/or the graphene are difficult to use with the usual tin solder used in electronics soldering, the traditional method for such electronic connections. In one embodiment, the traditional soldering process is not used, and instead the material are welded or riveted together when the metal in the sandwich is compressed by the contraction of the metal. The ETFE membrane, having a melting point of between 255 and 280° C. and as high as 332 to 335° C., has recesses or holes adjacent to the superconducting graphene path.

Through these openings (again also as a multi-layer, just like a PCB), the traditional metallic terminals may be inserted (as is done during reflow operations for PCBs), which when immersed in liquid tin (molten at 232° C. to 235° C.) will simultaneously heat and expand the metal, adhering to it through the traditional capillary effect in the hollows/openings. As a result, the combination will form a rivet-like configuration which shrinks upon cooling, exerting compression to the cable which has elastic properties and thus contacting each other.

In an alternate embodiment, a further laminate of ETFE is applied, leaving apertures at the contact points so that the components may be interconnected via traditional methods (mechanical pressure, welding, soldering, etc.) where the components are interconnected to a connector. In one embodiment FIGS. 25-27, the exposed leads from one or more layers are simply mechanically connected by pressing them between the connector head 2702 and the pins 2704 in the connector 1002. Both films are seared together to form a cable and/or flexible printed board. Note the tab 2706 is used to remove the low-profile 1.44 mm connector. Note that the above process may be used in combination with a continuous pattern of shaped wire wheel to make extensive lengths, or to form into traditional printed circuit boards (PCBs).

In another embodiment, connection between cable ends may be accomplished by spreading copper powder, or any other suitable electrically transmitting material, into the gaps between the cables containing the sandwiched metal, and then mechanically pushing it in at the same time as heat is applied, this will create an interlink of the copper with the graphene which attaches to the ETFE, creating a contact point that may be then connected via tin or other suitable surface mount method.

Figure 17:
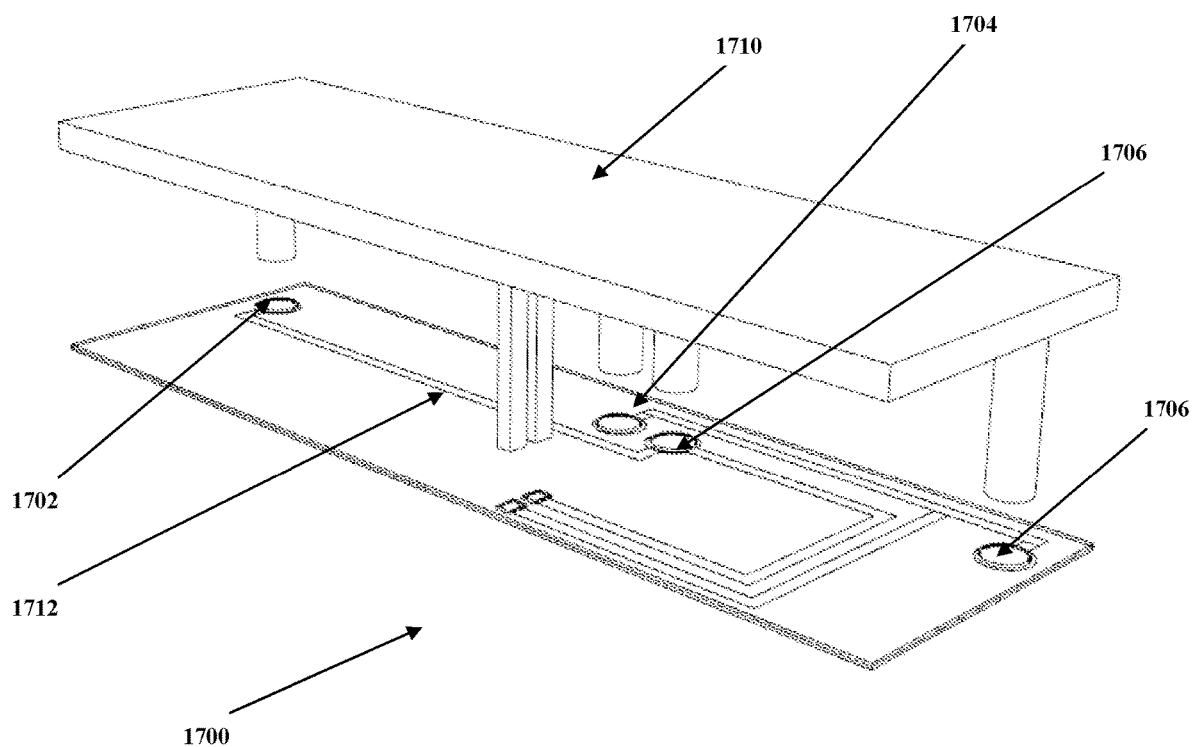
FIG. 17 shows an illustration of the contact point attachment jig, according to an exemplary embodiment of the invention.
Figure 18:
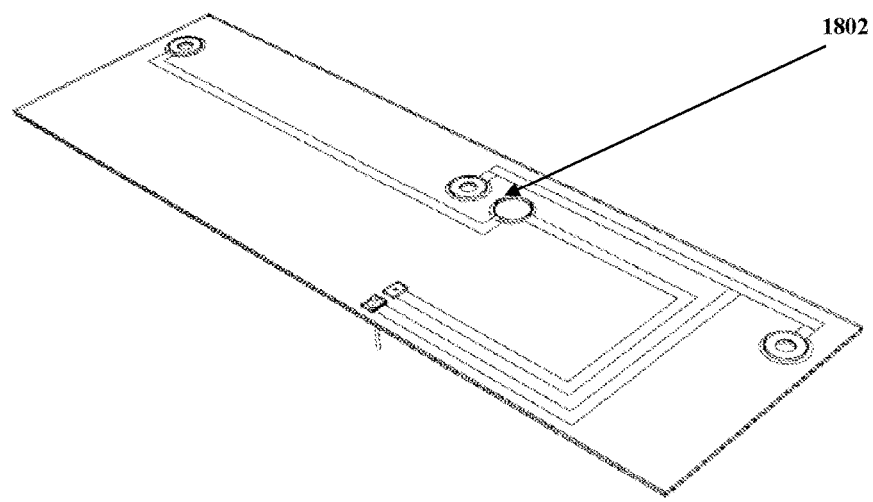
FIG. 18 shows an illustration of the attachment points within a low loss cable, according to an exemplary embodiment of the invention.
Figure 19:
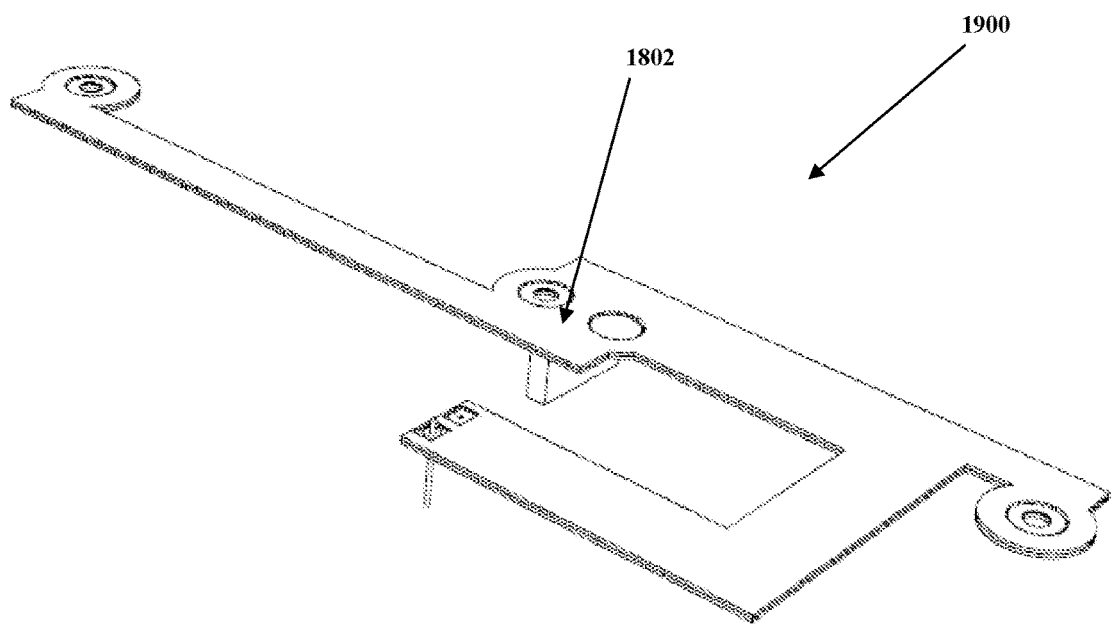
FIG. 19 shows an illustration of a complete graphene cable, according to an exemplary embodiment of the invention.
Figure 20:
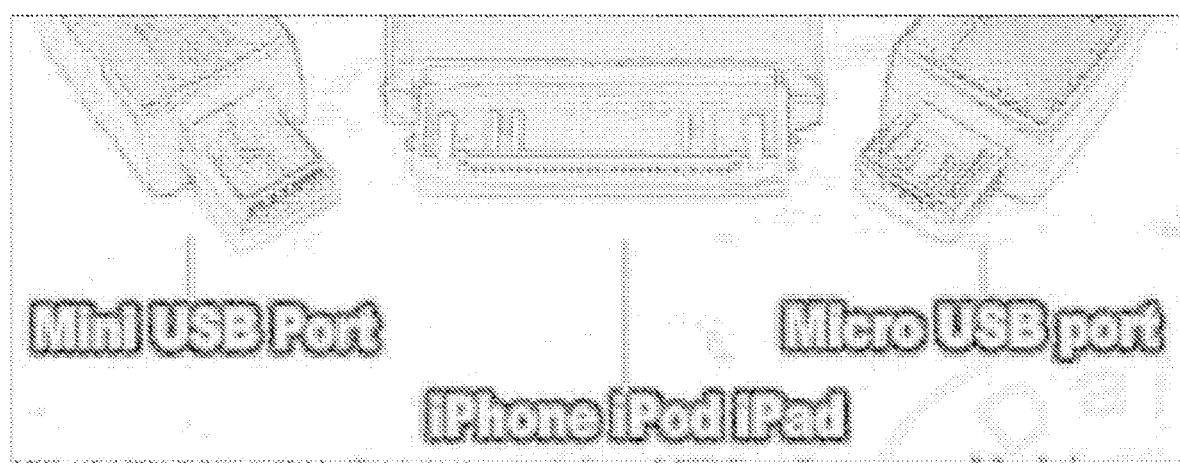
FIG. 20 shows an illustration of various USB connectors, according to prior art.
Figure 21:
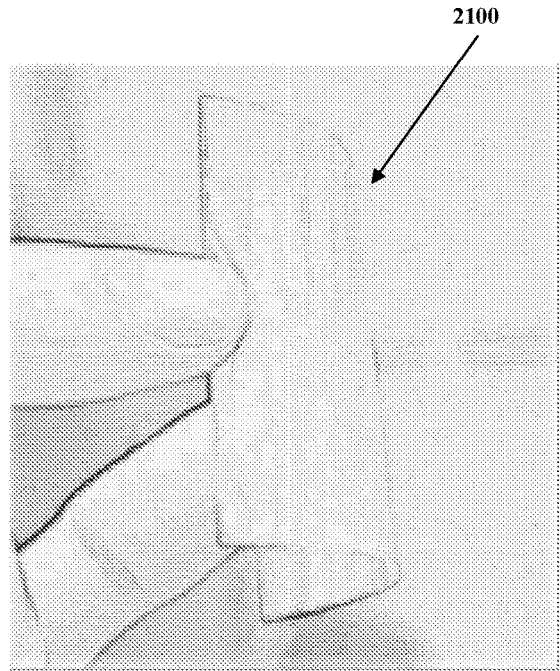
FIG. 21 shows a graphene double layer 90% translucent photovoltaic laminate, according to an exemplary embodiment of the invention.
Figure 22:
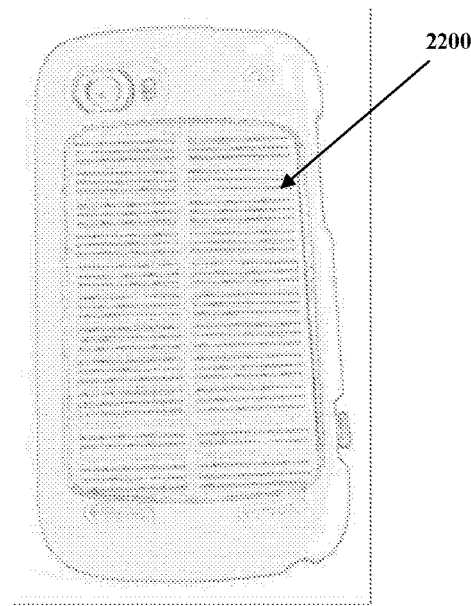
FIG. 22 shows an illustration of the case installed on a cell phone, according to an exemplary embodiment of the invention.
Figure 23:
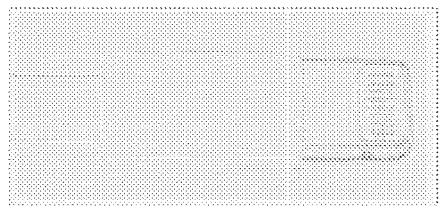
FIG. 23 shows an illustration of a typical Apple connector, according to prior art.
Figure 24:
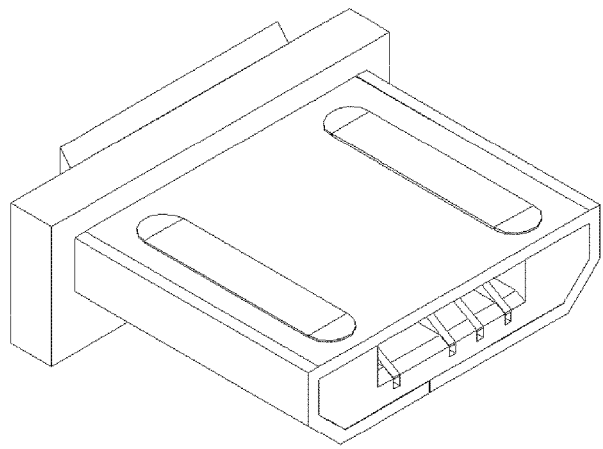
FIGS. 24-28 show illustrations of low profile 1.44 mm cap and shortened connectors, according to an exemplary embodiment of the invention.
Figure 25:
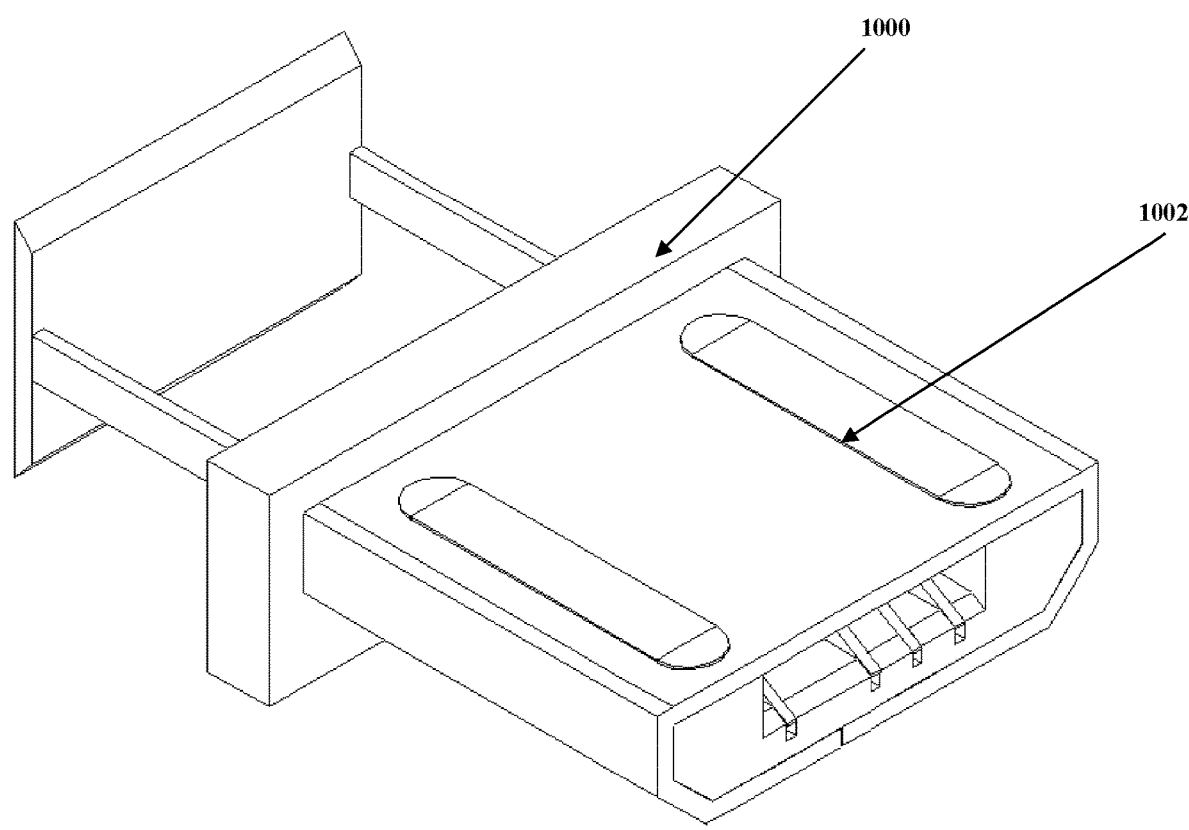
Figure 26:
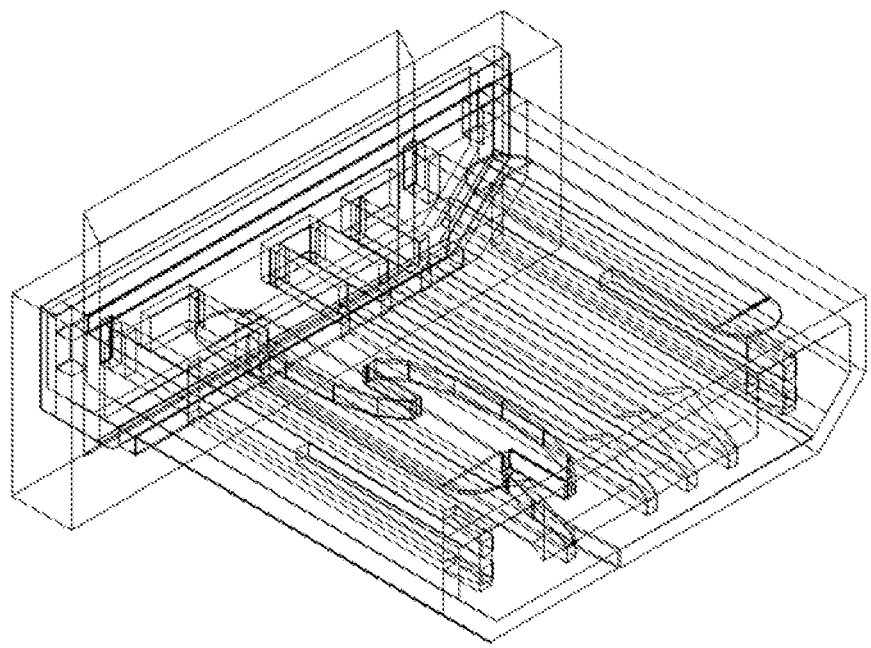
Figure 27:
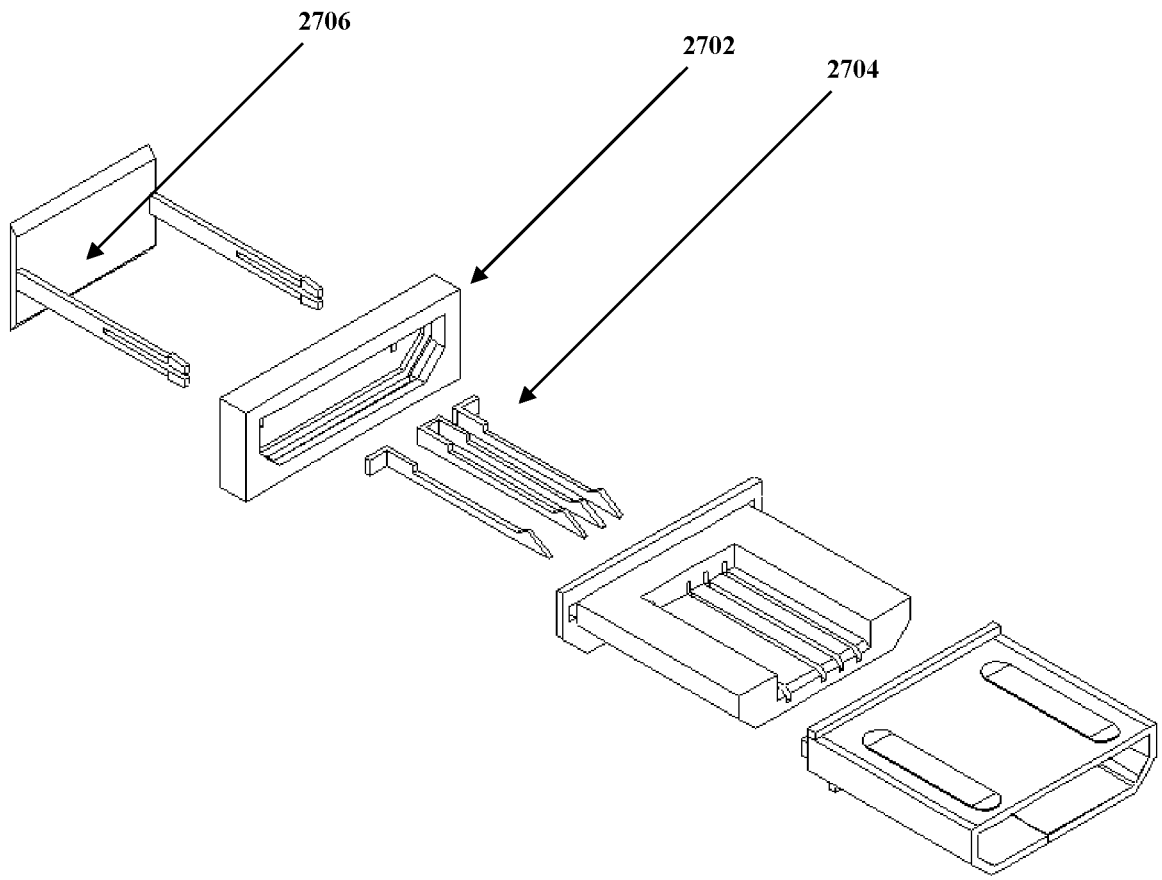
Figure 28:
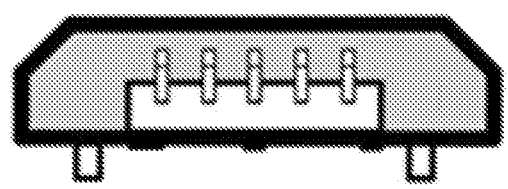

In an alternate embodiment FIG. 17, a similar metal powder (again, copper or other suitable metal) is suspended in a fluid solution (distilled water, alcohol or any other suitable fluid) and applied 1700 at the contact points 1702, 1704, 1706, 1704 for the graphene superconducting vias 1712. The points are then pressed by an appropriately shaped tool 1710 which at the same time applies heat. This evaporates the fluid and results in an appropriate contact point. Whether through-hole or surface mounted, (FIG. 18) electrical components 1802 (such as the actual photovoltaic cells connection 1006 in FIG. 10) may adhere to the cable if so required. The above methods have the advantage of "pushing" up the solder/connector material from the back of the cable.

The above (FIG. 19) finished graphene or GRAEFTENO cable 1900 has the potential to double the photovoltaic cell energy transmitted and delivered, meaning that the received light rays (be they natural sunlight or office lights) are the same but 99% more efficient. The above low resistivity cabling allows for the generation of sufficient energy from any luminous source (be it manmade or natural light), so that in addition to the sun's energy, the system may generate energy when exposed to interior lights, reflections, etc.

Figure 10:
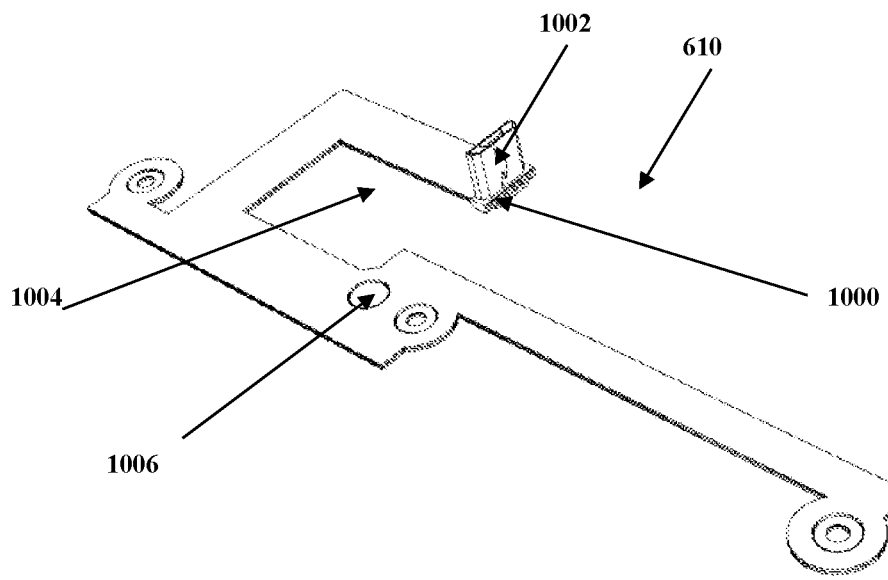
FIG. 10 shows an illustration of a flat graphene cable, according to an exemplary embodiment of the invention.
Figure 11:
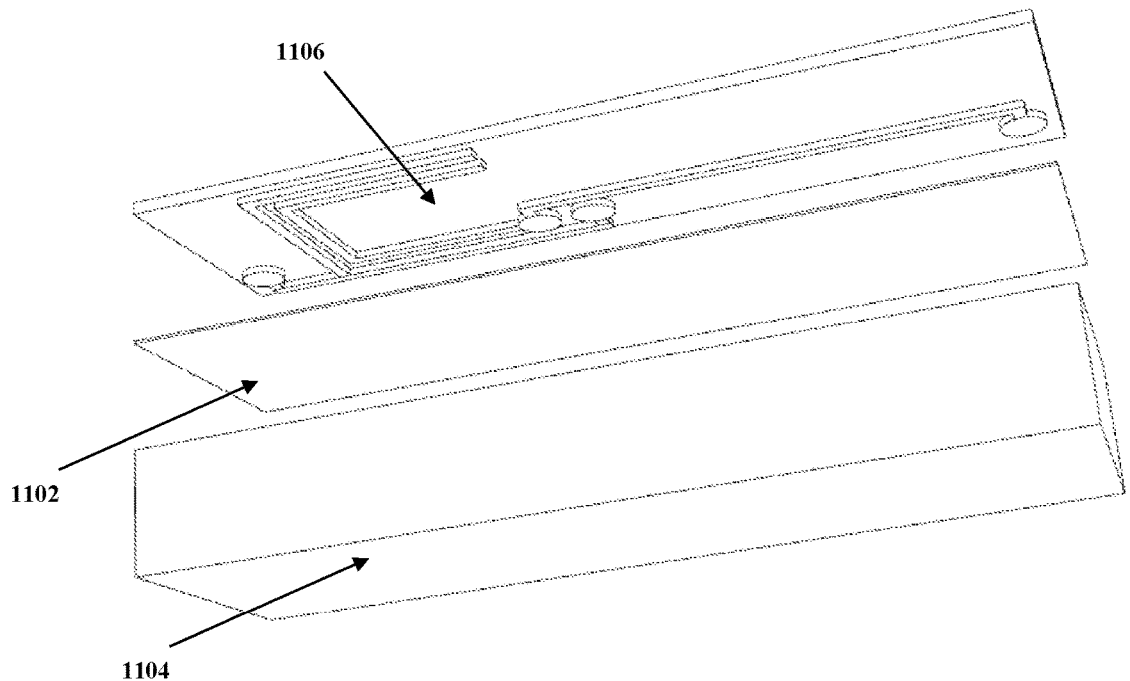
FIG. 11 shows an illustration of the manufacture process for a graphene cable, according to an exemplary embodiment of the invention.
Figure 12:
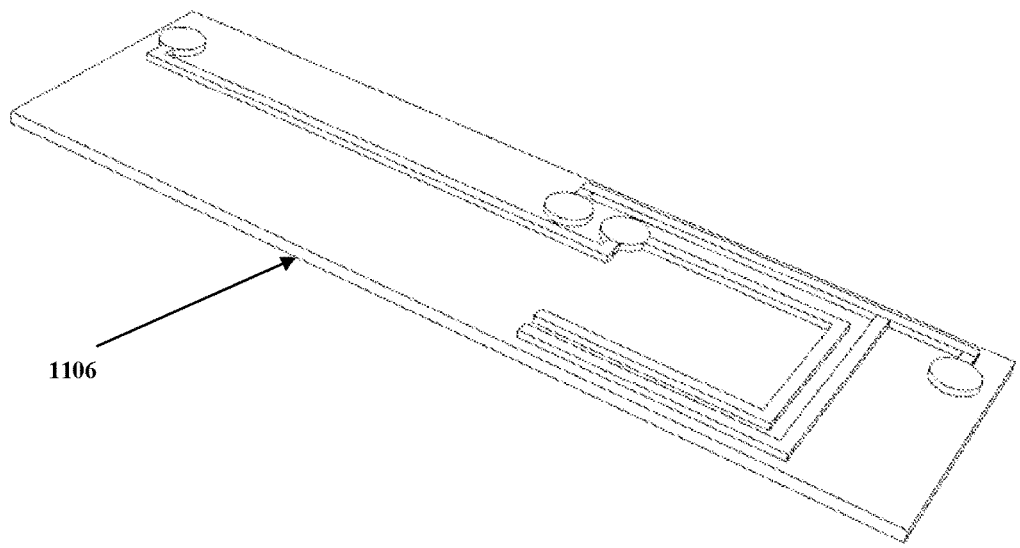
FIG. 12 shows an illustration of an embossed design pattern, according to an exemplary embodiment of the invention.
Figure 13:
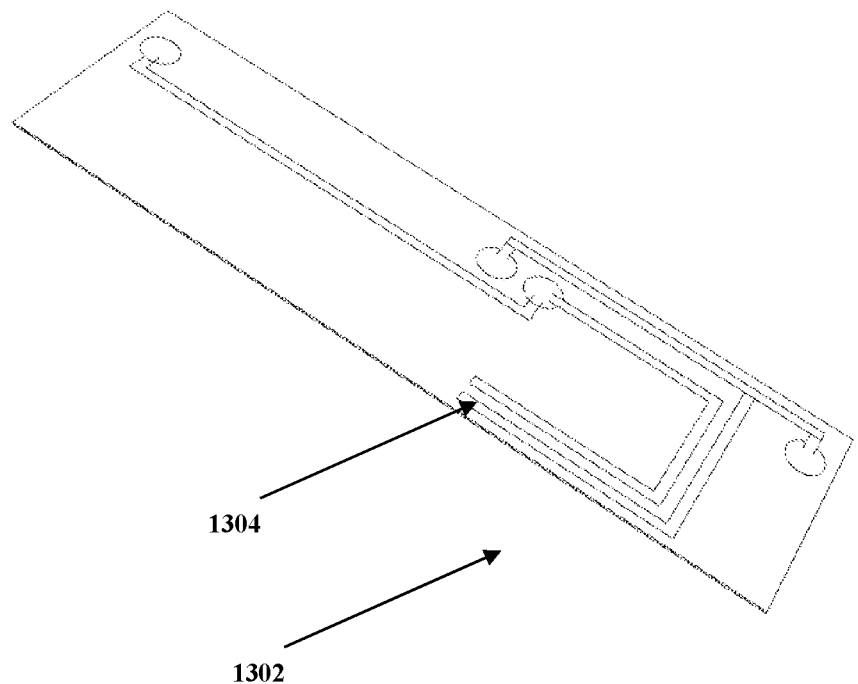
FIG. 13 shows an illustration of the thin graphene cable component, according to an exemplary embodiment of the invention.
Figure 14:
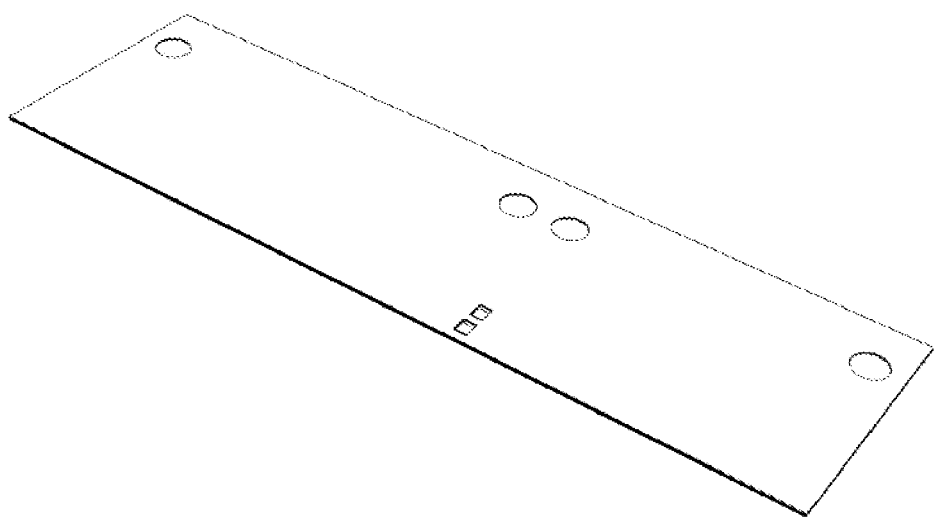
FIG. 14 shows an illustration of the back of the graphene component, according to an exemplary embodiment of the invention.
Figure 15:
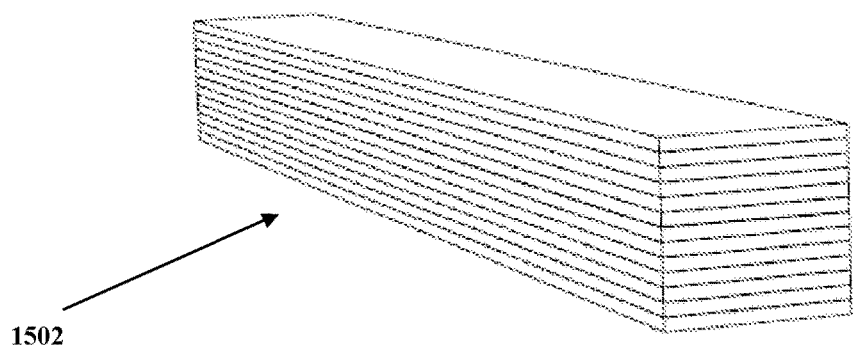
FIG. 15 shows an illustration of a multi-layer graphene cable, according to an exemplary embodiment of the invention.
Figure 16:
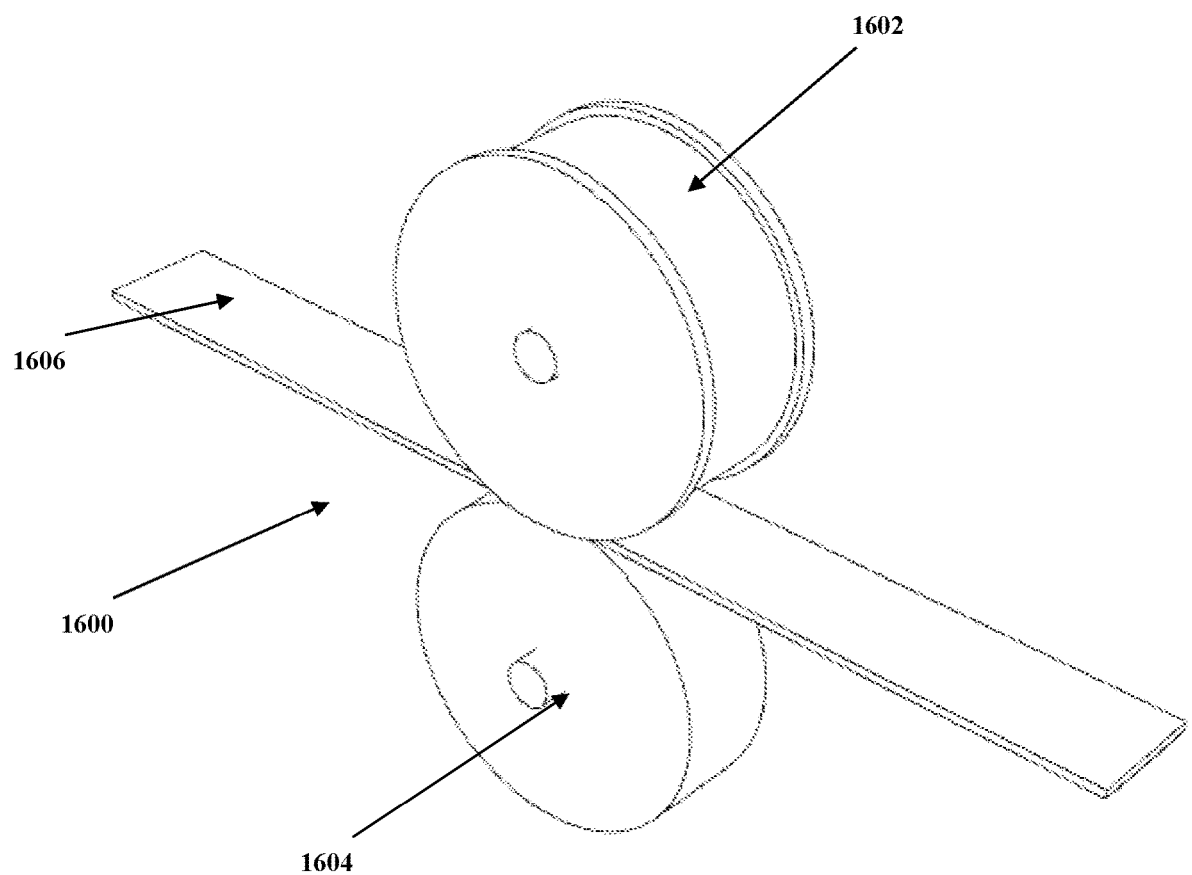
FIG. 16 shows an illustration of a continuous engraving process jig, according to an exemplary embodiment of the invention.

Referring to FIG. 10, we see one embodiment where the cable 1004 connects to the device connector 610 along the side or top of the insertion portion 1002, freeing the cap area 1000 and allowing for a very low profile connection. To create such a low profile 1.44 mm connector, a number of steps would be taken, the traditional metal insertion portion would have no clips or pinching protrusions. The inside connectors would be only four much shorter copper contacts (no need to have the other communication links). The two pressure points designed to keep the longer connector 900 when the cable effects any pull would be eliminated. The internal plastic tab would have only four connectors, instead of the 5 or 7 in the micro USB or mini USB connectors. By being closer/shorter the profile is reduced and the traditional connector 900 would be eliminated.

The actual shape of the photocell 2200 in the back of the phone is really dependent on issues such as camera, flash, noise cancelling microphone, etc. It should be notes that by using transparent photovoltaic cells (some allowing up to 99% translucence 2100), the ability to apply a photovoltaic cell to the back and/or front (over the touch screen) of the unit may be achieved, both connected to the actual handset via one or more GRAEFTENO cables.

In such a fashion, in one embodiment, the flexible cable 1004 may be used to connect the photovoltaic cell pack 2200 to the portable electronic unit. In an alternate embodiment, the cable 1004 is used to connect each individual photovoltaic cell within the cell pack 2004 in cascade to the device 600 via a low profile 1.44 mm connector 610 or some other type of connector.

Within the USB standard, a USB On-The-Go device is required to have one, and only one USB connector: a Micro-AB receptacle. This receptacle is capable of accepting both Micro-A and Micro-B plugs, attached to any of the legal cables and adapters as defined in Micro-USB1.01, for which it is the primary cable interface device for most portable devices.

Such portable devices are capable of connecting to a charger (be it powered by a vehicle (DC) or a home (AC to DC)). In a limited number of cases, solar or wind generators have been used to act as the AC generating source. Such an approach, suffers the losses of having a rectifier take DC to AC to DC voltages to charge the device.

CONCLUSION

In concluding the detailed description, it should be noted that it would be obvious to those skilled in the art that many variations and modifications can be made to the preferred embodiment without substantially departing from the principles of the present invention. Also, such variations and modifications are intended to be included herein within the scope of the present invention as set forth in the appended claims. Further, in the claims hereafter, the structures, materials, acts and equivalents of all means or step-plus function elements are intended to include any structure, materials or acts for performing their cited functions.

It should be emphasized that the above-described embodiments of the present invention, particularly any "preferred embodiments" are merely possible examples of the implementations, merely set forth for a clear understanding of the principles of the invention. Any variations and modifications may be made to the above-described embodiments of the invention without departing substantially from the spirit of the principles of the invention. All such modifications and variations are intended to be included herein within the scope of the disclosure and present invention and protected by the following claims.

The present invention has been described in sufficient detail with a certain degree of particularity. The utilities thereof are appreciated by those skilled in the art. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

The invention claimed is:

1. A method for manufacturing a room temperature low resistivity cable comprising;
   pressing an embossed design pattern across a thin film against a graphite source;
   heating said design pattern to a temperature above 255 deg. Celsius until a graphene layer (bidimensional (2D) compounds per $sp^2$-chain of hybrid carbon atoms in honeycomb configuration) adheres to said film;
   removing said film from said graphite source, delaminating and forming a graphene layer on said film;
   said film is comprised of Ethylene tetrafluoroethylene (ETFE) or ETFE like material;
   said embossing design pattern is pressed by a linear mold; and
   wherein said cable has one or more openings on one or more of the ETFE or ETFE like film surfaces that allow electrical connection access to the graphene layer.

2. The method of claim 1 wherein;
   said electrical connection is accomplished by a mechanical linkage.

3. The method of claim 1 wherein;
   said connection is accomplished by a capillary linkage.

4. A method for manufacturing a room temperature low resistivity cable comprising;
   pressing an embossed design pattern across a thin film against a graphite source;
   heating said design pattern to a temperature above 255 deg. Celsius until a graphene layer (bidimensional (2D) compounds per $sp^2$-chain of hybrid carbon atoms in honeycomb configuration) adheres to said film;
   removing said film from said graphite source, delaminating and forming a graphene layer on said film;
   said film is comprised of Ethylene tetrafluoroethylene (ETFE) or ETFE like material; and
   said embossing design pattern is pressed by a wheel mold.

5. The method of claim 4 wherein;
   said electrical connection is accomplished by a mechanical linkage.

6. The method of claim 5 wherein;
   said connection is accomplished by a capillary linkage.

7. The method of claim 6 wherein;
   said connection is accomplished by evaporating a metallic powder suspended in a fluid.

* * * * *